(12) United States Patent
Matsumiya et al.

(10) Patent No.: US 6,480,390 B2
(45) Date of Patent: Nov. 12, 2002

(54) CARD-TYPE PERIPHERAL DEVICE

(75) Inventors: Hiroshi Matsumiya, Tokyo (JP); Nobuo Saitoh, Tokyo (JP); Naoki Ikemori, Tokyo (JP)

(73) Assignee: Fujitsu Takamisawa Component Limited, Tokyo (JP)

( * ) Notice: Subject to any disclaimer, the term of this patent is extended or adjusted under 35 U.S.C. 154(b) by 0 days.

(21) Appl. No.: 09/771,690

(22) Filed: Jan. 30, 2001

(65) Prior Publication Data

US 2001/0017771 A1 Aug. 30, 2001

(30) Foreign Application Priority Data

Feb. 29, 2000 (JP) ........................................ 2000-058009

(51) Int. Cl.[7] .............................. H05K 5/02; H01R 9/00; H01R 13/447
(52) U.S. Cl. ...................... 361/736; 367/752; 367/753; 367/803; 367/823; 439/135
(58) Field of Search ................................. 361/752, 736, 361/754, 755, 787, 789, 784, 796, 802, 741, 798, 737, 800, 803; 174/52.4; 439/137, 131, 135, 136, 138–145; 211/41.17

(56) References Cited

U.S. PATENT DOCUMENTS

| 4,914,265 | A | * | 4/1990 | Mongeau ..................... 200/330 |
| D408,786 | S | * | 4/1999 | Goto ........................ D13/381 |
| 6,231,361 | B1 | * | 5/2001 | Ko et al. ..................... 439/172 |
| 6,313,982 | B1 | * | 11/2001 | Hino ........................... 361/679 |

* cited by examiner

*Primary Examiner*—David Martin
*Assistant Examiner*—Dameon E. Levi
(74) *Attorney, Agent, or Firm*—Staas & Halsey LLP

(57) ABSTRACT

A card-type peripheral device with a connector element, the device comprising the function of shielding contacts when the device is not in use. The device comprises a circuit board, a connector element including a plurality of contacts for connecting a circuit board to an intended apparatus, and a hollow card-type housing having openings for exposing an contact portion on the intended apparatus side of each contact. The housing contains the circuit board fixedly, and the connector element movably, therein. The connector element has a slide knob, and by moving the slide knob within a slide knob opening, can assume two states including an open state in which the contact portions are exposed from the openings and connectable with the terminals of the intended apparatus and a closed state in which the contact portions are contained in the housing and protected from external dust and dirt, etc.

13 Claims, 13 Drawing Sheets

CARD-TYPE PERIPHERAL DEVICE

BACKGROUND OF THE INVENTION

1. Field of the Invention

The present invention relates to a peripheral device used by being connected to the body of an electronic apparatus or, in particular, to a card-type peripheral device comprising a connector element having a plurality of contacts.

2. Description of the Related Art

A card-type peripheral device used by being removably mounted on the body of a portable small-sized electronic apparatus such as a digital camera or a small-sized game machine is known. The card-type peripheral device which has recorded therein personal information, technical data, music, dynamic and static images, game software, etc. are used and stored in a great variety of environments.

Generally, a card-type peripheral device comprises a circuit board having mounted thereon electronic parts, a connector element for connecting the circuit board to an intended apparatus on which the device is to be mounted, and a card-type hollow housing for containing the circuit board and the connector element. For this card-type peripheral device to ensure normal functions even in environments exposed to dust or dirt, etc., the contact reliability of the contacts of the connector element making up an interface is very important.

In the conventional device, the contacts are generally not protected, so that in the case where the device is stored in an environment exposed to dust or dirt, the dust and dirt are accumulated, among others, on the contact portions of the contacts causing an unstable contacting operation, thereby often leading to a deteriorated conductivity.

The conventional device is also designed to make it difficult for dust or dirt to accumulate on the contact portions of the contacts by arranging them at a position in the depth of the housing. However, the lead-in portions arranged on the housing for connecting the terminals of the intended apparatus to the contacts are always open and therefore the accumulation of dust and dirt is not prevented satisfactorily.

SUMMARY OF THE INVENTION

The object of the present invention is to provide a card-type peripheral device with a connector element, the device comprising the function of shielding the contacts to prevent the accumulation of dust and dirt on the contacts when the device is not in use.

In order to achieve the object described above, according to this invention, there is provided a card-type peripheral device comprising a circuit board, a connector element including contacts connected to the circuit board, a hollow card-like housing having openings for exposing the contacts and accommodating the circuit board and the connector element, and shield means for selectively shielding the contacts of the connector element.

In this configuration, the accumulation of dust or dirt can be prevented by shielding the contacts when the device is not in use.

According to one preferred aspect of the invention, there is provided a card-type peripheral device, wherein the shield means includes a moving mechanism for selectively arranging the connector element in said housing at either a first position where the contacts are exposed to the openings or a second position where the contacts are shielded within the housing.

In this configuration, the accumulation of dust or dirt on the contacts can be prevented by relocating the connector element to the second position when the device is not in use.

According to another aspect of the invention, there is provided a card-type peripheral device, wherein the connector element is movable independently of the circuit board, and the contacts are connected to the circuit board when the connector element is located at the first position, while the contacts are separated from the circuit board when the connector element is located at the second position.

In this configuration, the accumulation of dust or dirt can be prevented by moving the connector element alone to the second position and thus shielding the contacts within the housing when the device is not in use.

According to still another aspect of the invention, there is provided a card-type peripheral device, wherein the connector element is made up of a second circuit board separate from the first circuit board and the contacts may be formed as a pattern on the second circuit board.

In this configuration, the accumulation of dust or dirt can be prevented by moving the second circuit board alone to the second position and thus shielding the contacts within the housing when the device is not in use.

According to yet another aspect of the invention, there is provided a card-type peripheral device, wherein the connector element includes a base member separate from the circuit board and the contacts may be made of conductive plates fixed on the base member.

In this configuration, the accumulation of dust or dirt can be prevented by moving only the base member having fixed thereon the contacts made up of the conductive plate to the second position and thus shielding the contacts within the housing when the device is not in use.

According to a further aspect of the invention, there is provided a card-type peripheral device, wherein the connector element is movable integrally with the circuit board and the contacts may be formed as a pattern on the circuit board.

In this configuration, the accumulation of dust or dirt can be prevented by moving the circuit board integrated with the connector element to the second position and thus moving the contacts into the housing when the device is not in use.

According to a still further aspect of the invention, there is provided a card-type peripheral device, wherein the moving mechanism may include an operational element for performing the operation, from the outside of the housing, for moving the connector element.

In this configuration, the accumulation of dust or dirt can be prevented by performing the operation, from the outside of the housing, for moving the connector element and thus shielding the contacts within the housing when the device is not in use.

According to a yet further aspect of the invention, there is provided a card-type peripheral device, wherein the moving mechanism may include an engaging element for releasably locking the connector element at the first position.

In this configuration, the connector can be locked releasably when the device is ready for use with the contacts exposed to the openings.

According to still another aspect of the invention, there is provided a card-type peripheral device, wherein the shield means includes a wall portion formed with the openings of the housing, and the wall portion may be arranged on the housing in such a manner as to be movable between a first position where the contacts of the connector element are exposed to the openings and a second position where the contacts are shielded with the wall portion superposed on the contacts.

In this configuration, the accumulation of dust or dirt on the contacts can be prevented by moving the wall portion to the second position and superposing it on the contacts.

According to yet another aspect of the invention, there is provided a card-type peripheral device, wherein the shield means may comprise a cover movably arranged on the housing for opening or closing the openings selectively.

In this configuration, the accumulation of dust or dirt on the contacts can be prevented by closing the openings with a cover when the device is not in use.

BRIEF DESCRIPTION OF THE DRAWINGS

The prevent invention will become more apparent from the following description of the preferred embodiments, with reference to the accompanying drawings, in which:

FIGS. 2a, 2b are perspective views schematically showing the connector element of a card-type peripheral device according to the embodiment shown in FIG. 1, in which FIG. 2a shows the upper surface and FIG. 2b shows the bottom surface;

FIGS. 3a, 3b are schematic partial sectional views taken in line X–X' of a card-type peripheral device according to the embodiment shown in FIG. 1, in which FIG. 3a shows the device in open state and FIG. 3b shows the device in closed state;

FIGS. 5a, 5b are perspective views schematically showing the connector element of a card-type peripheral device according to the embodiment shown in FIG. 4, in which FIG. 5a shows the upper surface and FIG. 5b shows the bottom surface;

FIGS. 6a, 6b are schematic partial sectional views taken in line Y–Y' of a card-type peripheral device according to the embodiment shown in FIG. 4, in which FIG. 6a shows the device in open state and FIG. 6b shows the device in closed state;

FIGS. 9a, 9b are diagrams schematically showing the internal structure of a card-type peripheral device according to the embodiment shown in FIG. 7, in which FIG. 9a shows the device in open state and FIG. 9b shows the device in closed state;

FIGS. 13a, 13b are perspective views schematically showing a card-type peripheral device according to a seventh embodiment of the invention, in which FIG. 13a shows the device in open state and FIG. 13b shows the device in closed state;

FIGS. 14a, 14b are perspective views schematically showing a card-type peripheral device according to an eighth embodiment of the invention, in which FIG. 14a shows the device in open state and FIG. 14b shows the device in closed state;

FIGS. 15a, 15b are perspective views schematically showing a card-type peripheral device according to a ninth embodiment of the invention, in which FIG. 15a shows the device in open state and FIG. 15b shows the device in closed state.

DESCRIPTION OF THE PREFERRED EMBODIMENTS

Figure 1:
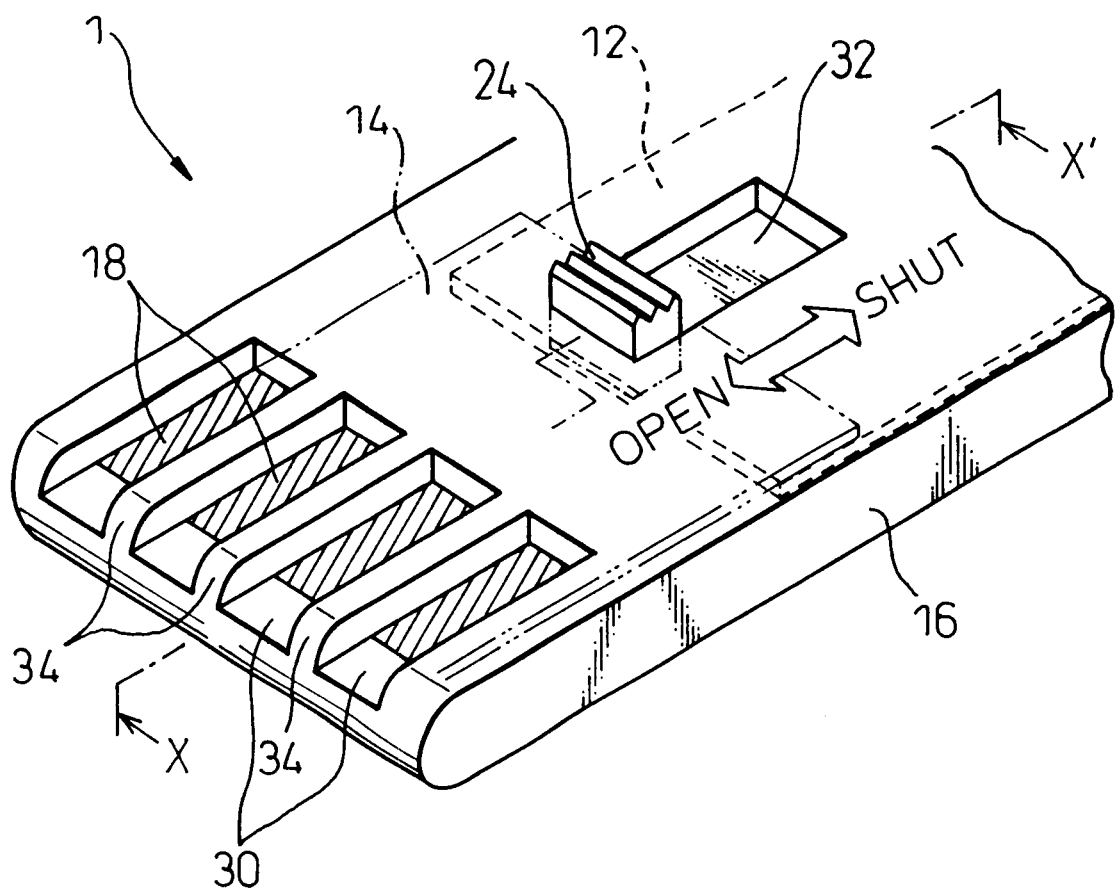
FIG. 1 is a partly enlarged perspective view schematically showing a card-type peripheral device according to a first embodiment of the invention.

Embodiments of the present invention will be descried in detail below with reference to the accompanying drawings. In the drawings, the same or similar component elements are designated by the same reference numerals, respectively.

FIG. 1 is an enlarged perspective view schematically showing a card-type peripheral device 1 according to a first embodiment of the invention. The card-type peripheral device 1 comprises a circuit board 12 having mounted thereon electronic parts such as a memory, a connector element 14 for connecting the circuit board 12 to an intended apparatus, and a hollow card-type housing 16 for containing the circuit board 12 and the connector element 14.

Figure 2A:
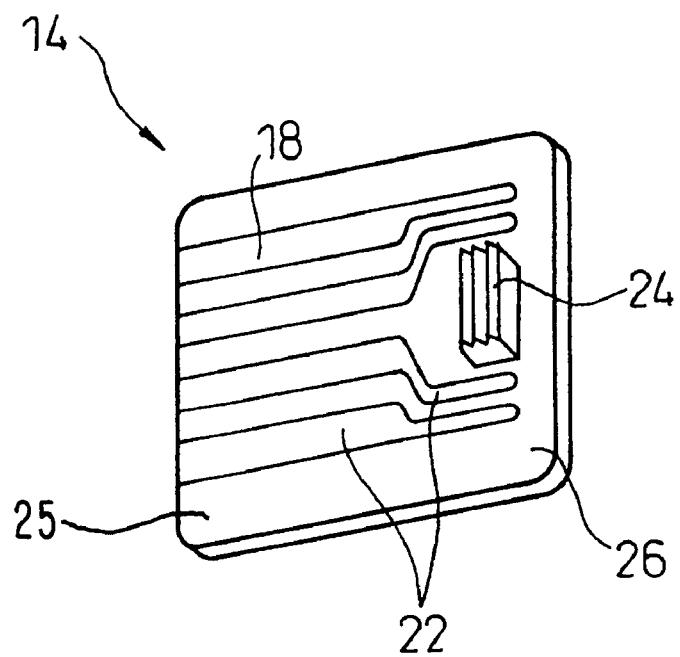
Figure 2B:
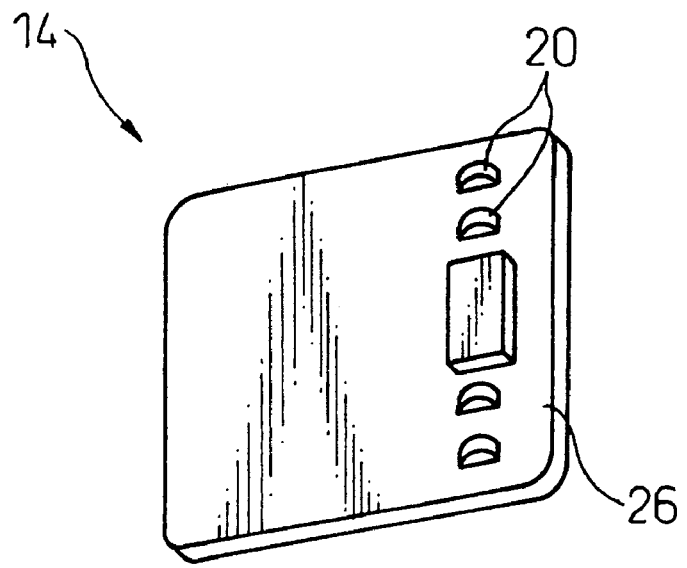

As shown in FIGS. 2 and 3, the connector element 14 includes a plurality of contacts 22 having intended apparatus-side contact portions 18 adapted to contact the terminals of an intended apparatus and circuit board-side contact portions 20 adapted to be in contact with the contact portions 28 of the circuit board 12, the contact portions 18 and the contact portions 20 being integrated with the contacts 22, a slide knob 24, and a base portion 26 with the contacts 22 and the slide knob 24 fixedly arranged thereon. The connector element 14 is mounted slidably in the housing 16, and includes a second circuit board 25 separate from the first circuit board 12, and the contacts 22 are formed as a pattern on the second circuit board 25.

The circuit board 12 includes a terminal 29 constituting a spring plate having at the forward end thereof a contact portion 28 adapted to contact the circuit board-side contact portions 20 of the contacts 22 of the connector element 14. The housing 16 is formed with a plurality of slit-like contact portion openings 30 for exposing the intended apparatus-side contact portions 18 of the connector element 14, and a rectangular opening 32 for accommodating the slide knob 24 of the connector element. The slide knob 24 is movable within the slide knob opening 32. Adjacent contact portion openings 30 are separated by each rib 34 (FIG. 1).

The dimension of the opening 32 for the slide knob is determined appropriately based on the relation between the dimension of the intended apparatus-side contact portions 18 of the contacts 22 of the connector element 14, the dimension of the contact portion openings 30 of the housing 16 and the dimension of the slide knob 24 in such a manner as to assure sufficient exposure of the intended apparatus-side contact portions 18 and the full containment of the particular contact portions 18 in the housing 16 by the movement of the slide knob 24 within the slide knob opening 32.

In the card-type peripheral device 1 according to this embodiment, the slide knob 24 of the connector element 14 is moved linearly within the slide knob opening 32 so that the connector element 14 is slid along a guide (not shown) in the housing. In this way, the connector element 14 can be selectively arranged at a first position where the intended apparatus-side contact portions 18 are exposed from the contact portion openings 30, i.e., in open state (FIG. 3a), or a second position where the intended apparatus-side contact portions 18 are contained in the housing 16 and not exposed to the openings 30, i.e. in closed state (FIG. 3b).

Figure 3A:
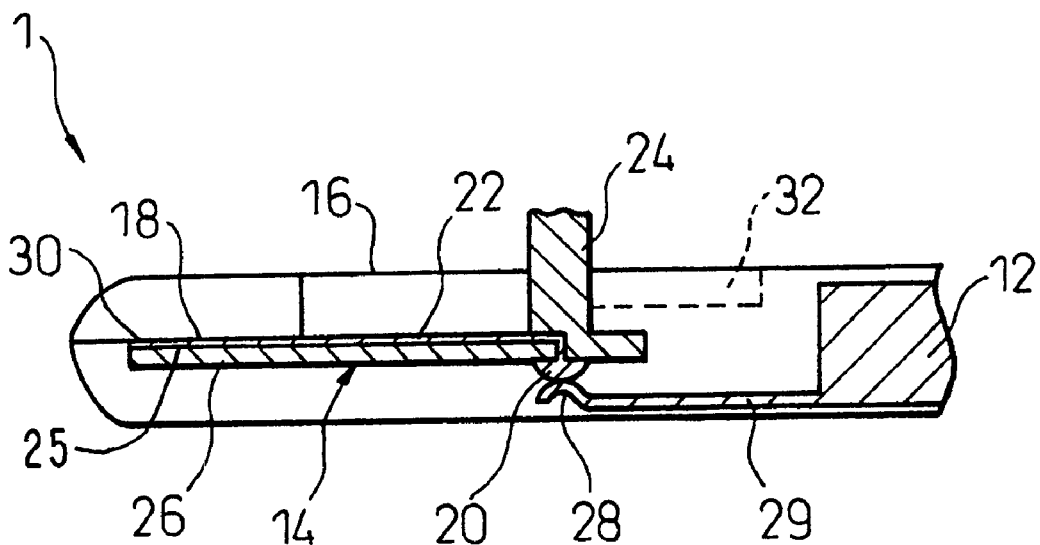

Specifically, when using the device 1, as shown in FIG. 3a, the slide knob 24 is moved toward the contact portion openings 30 of the housing 16 thereby to expose each intended apparatus-side contact portion 18 to a corresponding opening 30, thereby assuming a state adapted to contact the terminal of the intended apparatus. In the process, each circuit board-side contact portion 20 of the connector element 14 comes into contact with a corresponding contact portion 28 of each terminal 29 so that the intended apparatus and the circuit board 12 in the device 1 are electrically connected to each other. Incidentally, an engaging element may be arranged on the housing 16 and/or the connector element 14 so that the connector element 14 may be releasably locked at a position where the intended apparatus-side contact portions 18 are exposed.

Figure 3B:
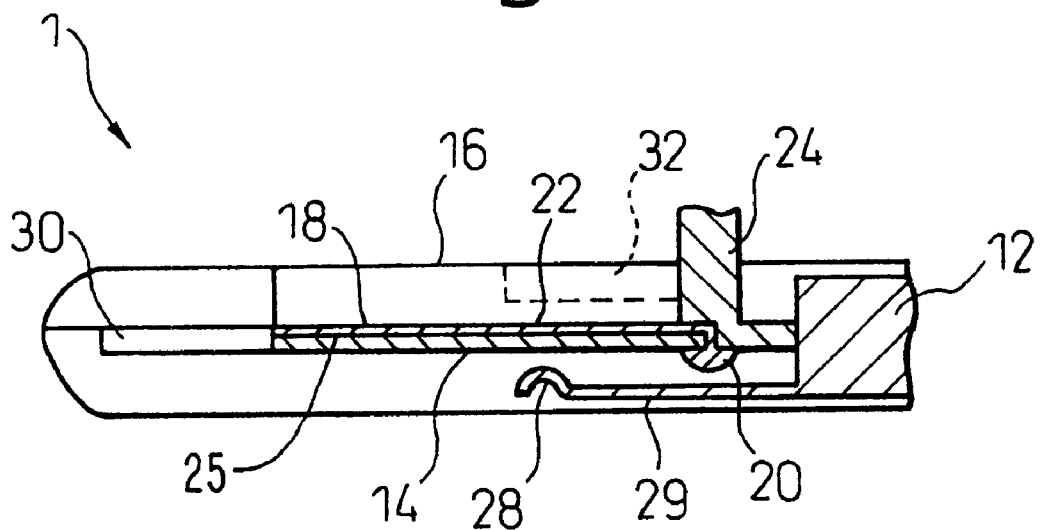

In the case where the device 1 is not in use, on the other hand, as shown in FIG. 3b, the slide knob 24 is moved away from the contact portion openings 30 of the housing 16 thereby to contain the intended apparatus-side contact portions 18 in the housing 16, thereby making it possible to protect the intended apparatus-side contact portions 18 from external dust and dirt, etc. In the process, each circuit board-side contact portion 20 of the connector element 14 is not in contact with each contact portion 28 of each terminal 29 of the circuit board 12.

Figure 4:
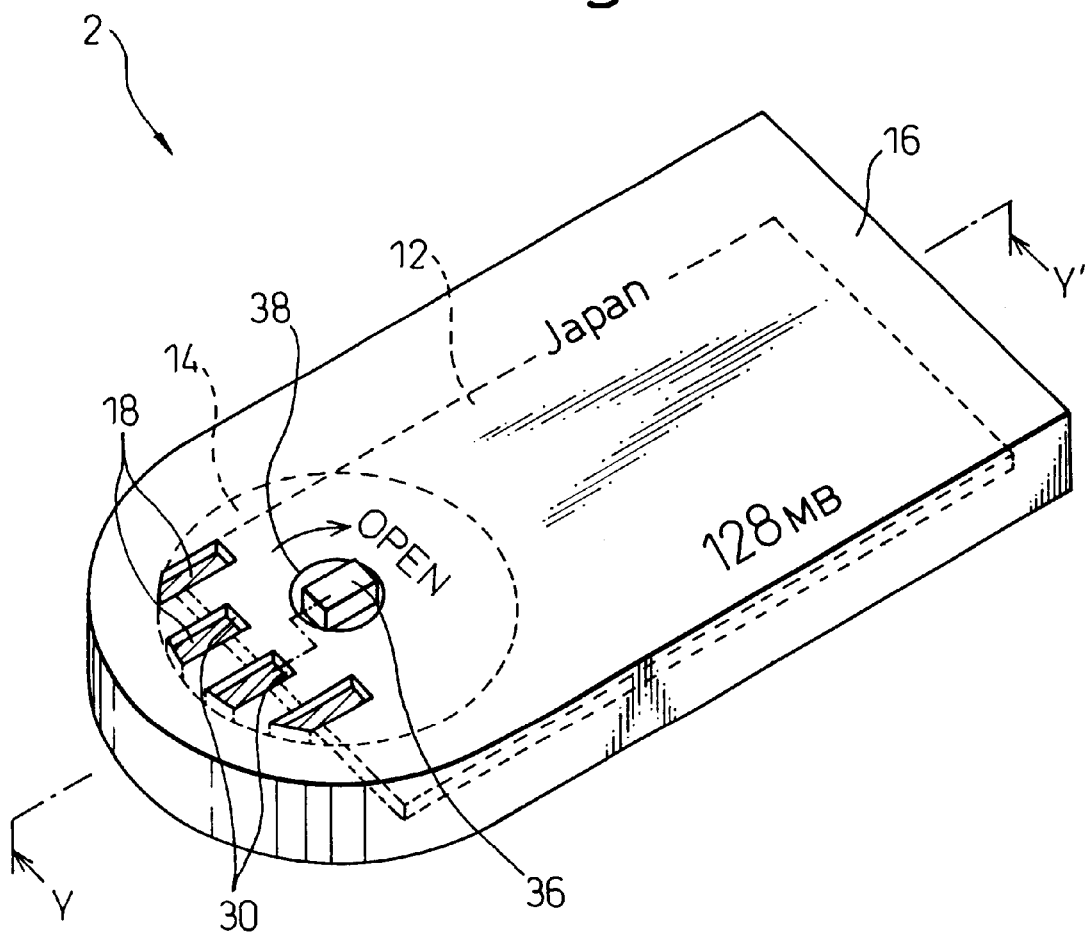
FIG. 4 is a perspective view schematically showing a card-type peripheral device according to a second embodiment of the invention.

FIG. 4 is a perspective view schematically showing a card-type peripheral device 2 according to a second embodiment of the invention. The card-type peripheral device 2, like the device 1 of the first embodiment, comprises a circuit board 12 with electronic parts such as a memory mounted thereon, a connector element 14 for connecting the circuit board 12 to an intended apparatus on which the device 2 is to be mounted, and a hollow card-type housing 16 for containing the circuit board 12 and the connector element 14.

Figure 5A:
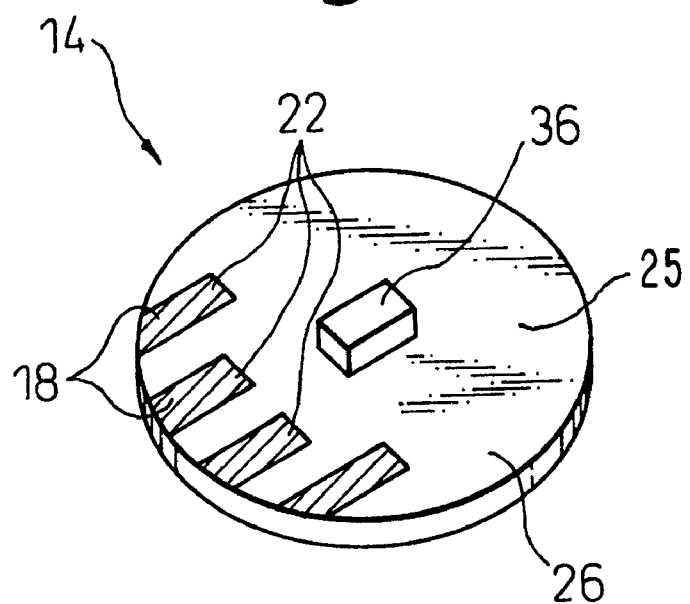
Figure 5B:
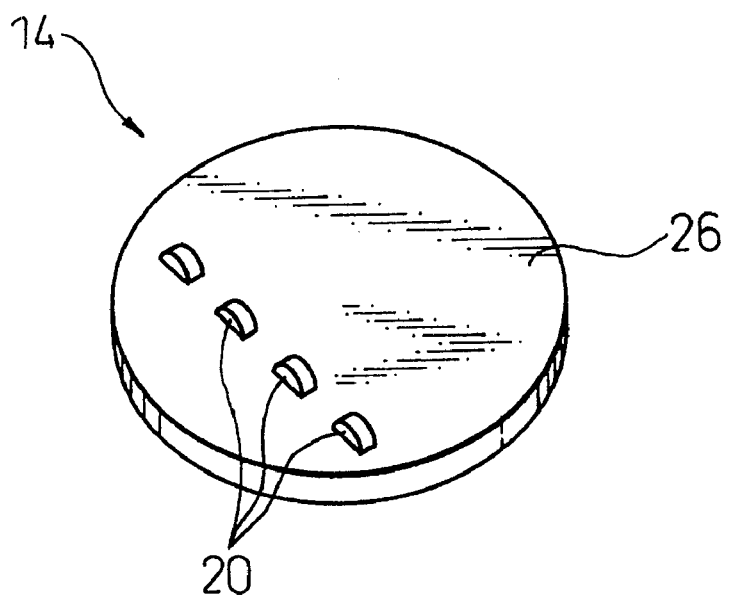

As shown in FIGS. 5 and 6, the connector element 14 is disk-shaped and includes a plurality of contacts 22 integrated with the intended apparatus-side contact potions 18 and the circuit board-side contact portions 20, a rotary knob 36, and a base portion 26 with the rotary knob 36 arranged fixedly thereon. The connector element 14 is mounted rotatably in the housing 16. The connector element 14 includes a second circuit board 25 separate from the circuit board 12, and the contacts 22 are formed as a pattern on the second circuit board 25.

The circuit board 12 includes a terminal 29 making up a spring plate having, at the forward end thereof, a contact portion 28 adapted to contact a corresponding one of the circuit board-side contact portions 20 of the contacts 22 of the connector element 14. The housing 16 includes a plurality of slit-like contact portion openings 30, and a circular opening 38 for receiving the rotary knob 36 of the connector element 14. The rotary knob 36 is rotatable in the opening 38.

In the card-type peripheral device 2 according to this embodiment, the rotary knob 36 of the connector element 14 is rotated within the opening 38 so that the connector element 14 is rotated within the housing 16. In this way, the connector element 14 can be selectively arranged at a first position where the intended apparatus-side contact portions 18 are exposed from the contact portion openings 30, i.e., in an open state (FIG. 6a), or a second position where the intended apparatus-side contact portions 18 are contained in the housing 16 and not exposed to the openings 30, i.e. in a closed state (FIG. 6b).

Figure 6A:
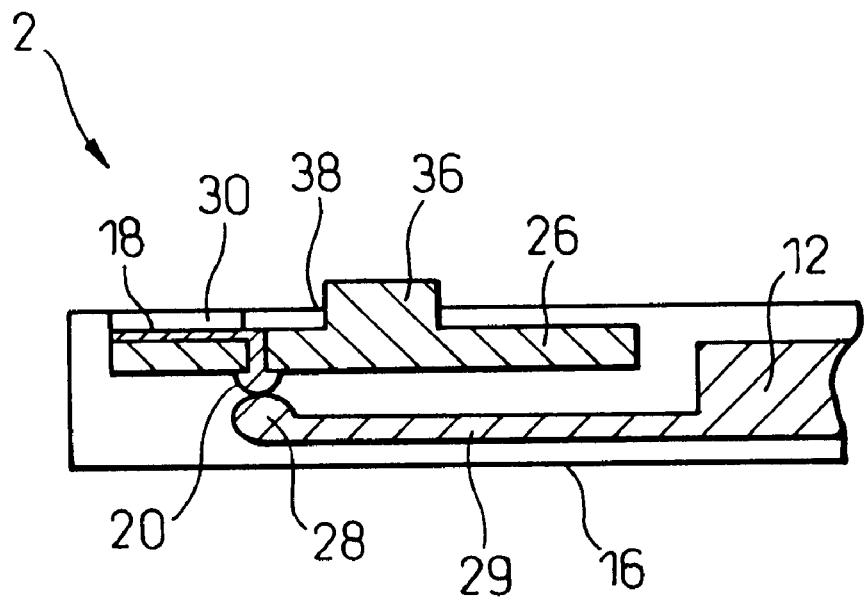

Specifically, when using the device 2, as shown in FIG. 6a, the rotary knob 36 is rotated to a position where each intended apparatus-side contact portion 18 of the connector element 14 is exposed from a corresponding one of the contact portion openings 30 of the housing 16 and assumes a state ready to contact the terminals of the intended apparatus. In the process, the circuit board-side contact portions 20 of the connector element 14 are each configured to contact a corresponding one of the contact portions 28 of the terminals 29 of the circuit board 12, so that the intended apparatus and the circuit board 12 in the device 2 are electrically connected to each other. Incidentally, an engaging element adapted to releasably lock the connector element 14 at a position where the intended apparatus-side contact portions 18 are exposed may be arranged on the housing 16 and/or the connector element 14.

Figure 6B:
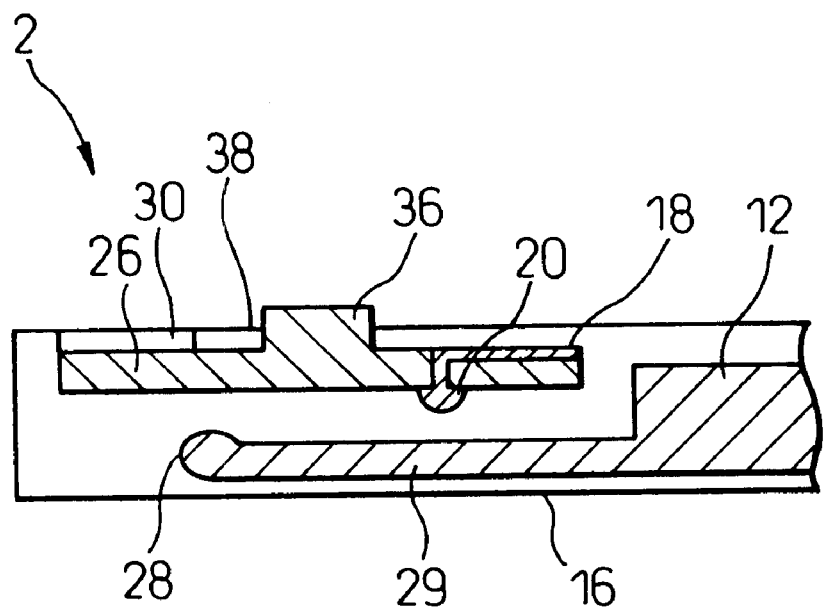

When the device 2 is not in use, on the other hand, as shown in FIG. 6b, the rotary knob 36 is rotated about 180° from the aforementioned position where each intended apparatus-side contact portion 18 of the connector element 14 is exposed from a corresponding one of the contact portion openings 30 of the housing 16 so that the intended apparatus-side contact portions 18 are contained in the housing 16 thereby to protect the intended apparatus-side contact portions 18 from external dust and dirt, etc. In the process, each circuit board-side contact portion 20 of the connector element 14 is not in contact with the contact portions 28 of the circuit board 12.

Figure 7:
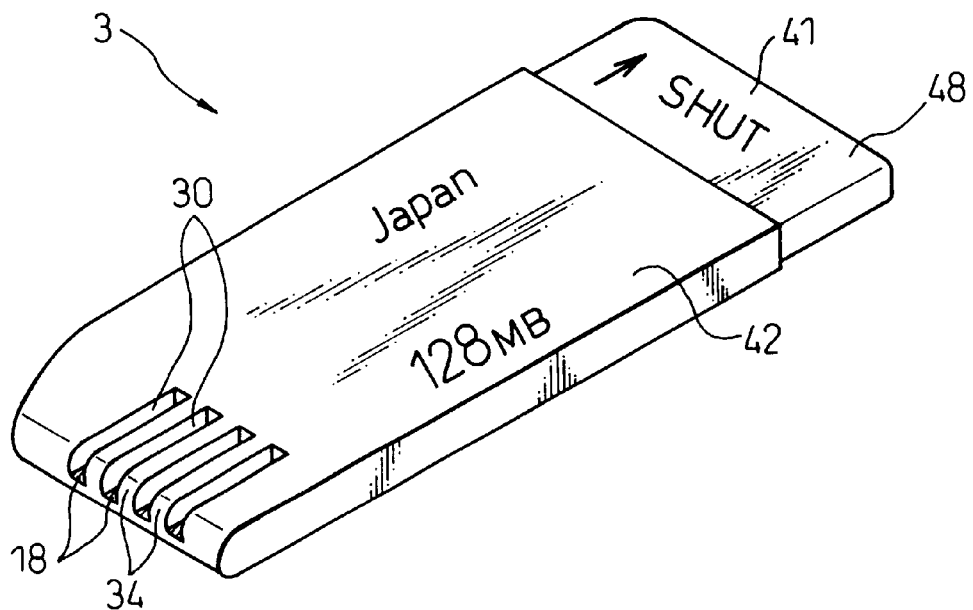
FIG. 7 is a perspective view schematically showing a card-type peripheral device according to a third embodiment of the invention.

FIG. 7 is a perspective view schematically showing a card-type peripheral device 3 according to a third embodiment of the invention. The card-type peripheral device 3 comprises a circuit board 41 having mounted thereon electronic parts such as a memory and integrated with a connector element 40 electrically connected to an intended apparatus on which the device 3 is to be mounted, and a hollow card-type housing 42 for slidably containing the circuit board 41.

Figure 8:
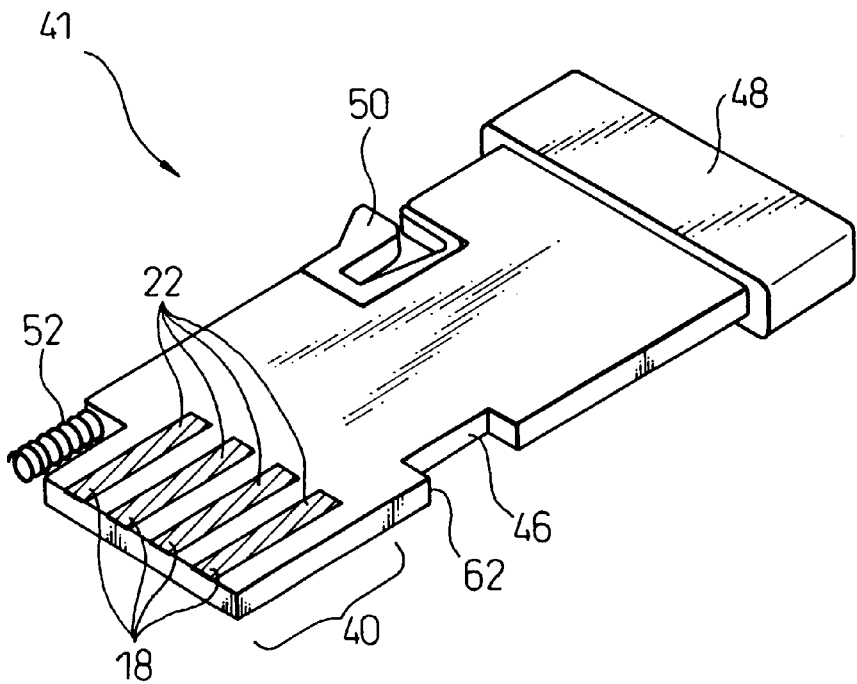
FIG. 8 is a perspective view schematically showing the circuit board of a card-type peripheral device according to the embodiment shown in FIG. 7.
Figure 9A:
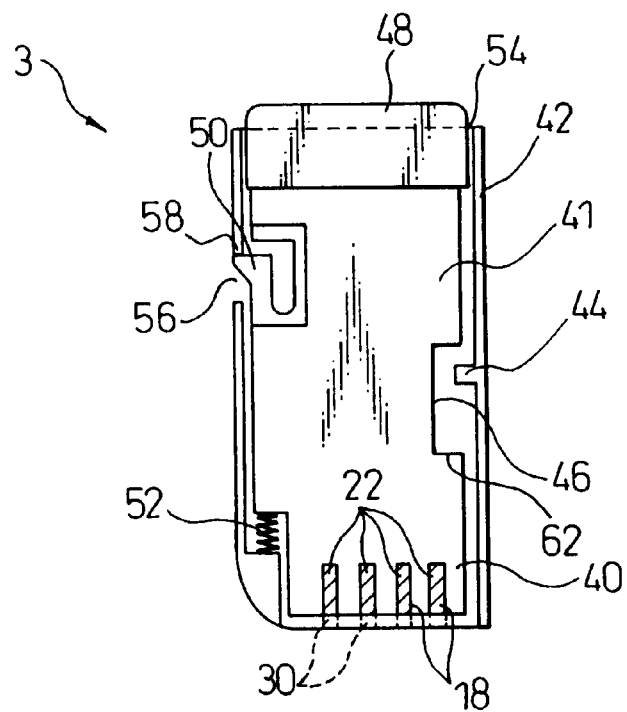
Figure 9B:
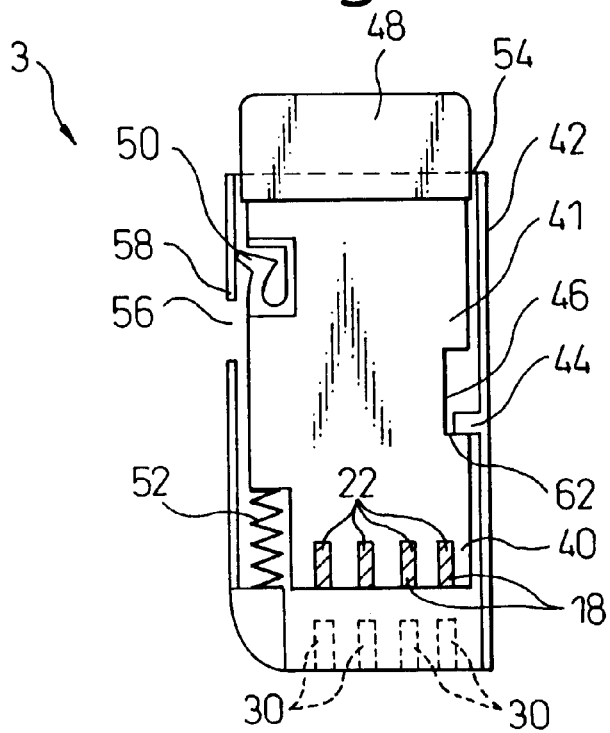

As shown in FIGS. 8, 9a and 9b, the circuit board 41 includes a connector element 40 having a plurality of contacts 22 formed as a pattern on the circuit board 41 along the front edge of the circuit board 41, a side recess 46 for receiving a stopper 44 arranged on the housing 42, a rear end operating button 48 for moving the whole circuit board 41 linearly, and an elastically deformable side slide lock pawl 50. The circuit board 41 configured this way is slidably mounted in the housing 42. The housing 42 includes a plurality of slit-like contact portion openings 30 formed at the front end thereof for exposing the contact portions 18 of the contacts 22 of the connector element 40, a rear end operating button opening 54 for receiving the operating button 48 of the circuit board 41, a side pawl opening 56 for receiving the slide lock pawl 50 of the circuit board 41, and the stopper 44 protruded inwardly on the side wall inner surface of the housing 42 for limiting the movement of the circuit board 41 in collaboration with the recess 46 of the circuit board 41. A compression spring 52 for biasing the circuit board 41 rearward is interposed between the circuit board 41 and the housing 42. Each adjacent pair of the contact portion openings 30 are separated by a rib 34.

In the card-type peripheral device 3 according to this embodiment, by moving the circuit board 41 longitudinally of the device in the housing 42, the connector element 40 can be selectively arranged at a first position where the contact portions 18 of the contacts 22 are exposed from the contact portion openings 30, i.e., in an open state (FIG. 9a), or a second position where the contact portions 18 are contained in the housing 42 and not exposed to the openings 30, i.e. in a closed state (FIG. 9b).

Specifically, when the device 3 is in use, as shown in FIG. 9a, the operating button 48 of the circuit board 41 is pushed toward the contact portion openings 30 of the housing 42 and by thus compressing the spring 52, the whole circuit board 41 is moved toward the contact portion openings 30 of the housing 42. In this way, the contact portion 18 of each contact 22 is exposed to a corresponding opening 30, thereby being made ready for contact with the terminals of the intended apparatus. Once the circuit board 41 has moved to a position where the contact portion 18 of each contact 22 of the connector element 40 of the circuit board 41 is sufficiently exposed to contact the terminals of the intended apparatus, the slide lock pawl 50 which is arranged on the circuit board 41 and has been inwardly elastically deformed enters the pawl opening 56 of the housing 42 and is deformed to restore the original shape. As a result, the pawl 50 engages the engaging edge portion 58 of the pawl opening 56, so that the circuit board 41 is maintained in open state against the biasing of the compression spring 52. The device 3 is mounted on the intended apparatus in this state.

In the case where the device 3 is not in use, to change the device 3 from the open state to the closed state, the slide lock pawl 50 received in the pawl opening 56 is pushed inward and elastically deformed thereby to disengage from the pawl opening 56. Under the spring force of the compression spring 52, the whole circuit board 41 then moves toward the operating button opening 54 of the housing 42, and the contact portion 18 of each contact 22 is contained in the housing 42. The movement of the whole circuit board 41 toward the operating button opening 54 of the housing 42 under the spring force of the compression spring 52 stops at an appropriate position where the contact portion 18 of each contact 22 of the connector element 40 of the circuit board 41 is fully contained in the housing 42, as the stopper 44 of the housing 42 comes to engage the stopper engaging portion 62 of the recess 46 formed in the circuit board 41 (FIG. 9b). Under this condition, each contact portion 18 is fully contained in the housing 42 and thus protected from external dust and dirt, etc.

Figure 10:
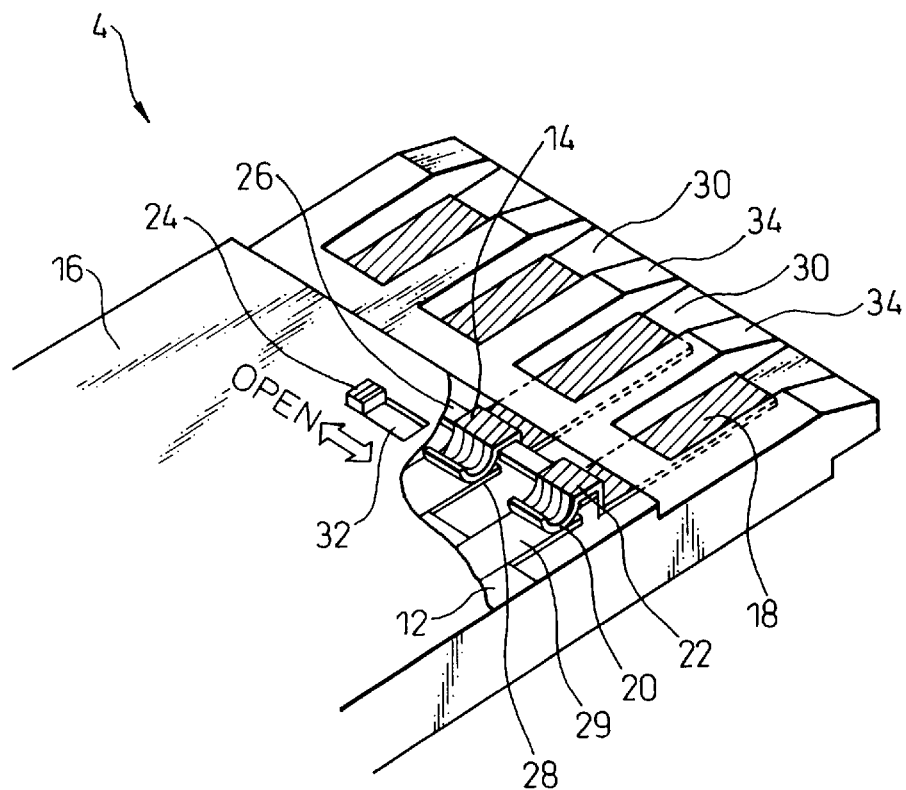
FIG. 10 is a partly enlarged schematic perspective view of a card-type peripheral device according to a fourth embodiment of the invention.

FIG. 10 is a partly enlarged perspective view schematically showing a card-type peripheral device 4 according to a fourth embodiment of the invention. The card-type peripheral device 4 comprises a circuit board 12 having mounted thereon electronic parts such as a memory, a connector element 14 for connecting the circuit board to an intended apparatus, and a hollow card-type housing 16 for containing the circuit board 12 and the connector element 14.

The connector element 14 includes a plurality of thin strip-like contacts 22 integrated with intended apparatus-side contact portions 18 and circuit board-side contact portions 20, a slide knob 24 and a base member, i.e. a base portion 26 having the contacts 22 and the slide knob 24 fixedly mounted thereon. The connector element 14 is slidably mounted in the housing 16 independently of the circuit board 12. The circuit board 12 includes terminals 29 each constituting a spring plate having at its forward end a corresponding contact 28 adapted to contact the corresponding circuit board-side contact 20 of the contact 22 of the connector element 14. The housing 16 includes a plurality of slit-like contact portion openings 30 for exposing the intended apparatus-side contact portions 18 of the connector element 14, and a rectangular opening 32 for receiving the slide knob 24 of the connector element 14. The slide knob 24 is movable laterally in the opening 32. Each adjacent pair of the contact portion openings 30 are separated from each other by a rib 34, under which a gap is formed for containing the intended apparatus-side contact portions 18 of the connector element 14.

The dimension of the slide knob opening 32 is determined appropriately based on the relation between the dimension of the intended apparatus-side contact portions 18 of the connector element 14, the dimension of the contact portion openings 30 of the housing 16 and the dimension of the slide knob 24, etc. in such a manner as to assure sufficient exposure of the intended apparatus-side contact portions 18 and the complete containment of the particular contact portions 18 in the housing 16 (specifically, under the ribs 34 in this embodiment) by the movement of the slide knob 24 within the opening 32.

In the card-type peripheral device 4 according to this embodiment, the slide knob 24 of the connector element 14 is moved linearly within the slide knob opening 32 so that the connector element 14 is moved in the housing. In this way, the connector element 14 can be selectively arranged at a first position where the intended apparatus-side contact portions 18 are exposed from the contact portion openings 30, i.e., in an open state (FIG. 10), or a second position where the intended apparatus-side contact portions 18 are contained under the ribs 34 and not exposed to the openings 30, i.e. in a closed state.

Specifically, when using the device 4, as shown in FIG. 10, the slide knob 24 is moved for placing the each intended apparatus-side contact 18 at a corresponding position between the ribs 34 and thereby to expose each intended apparatus-side contact portion 18 to a corresponding opening 30, thereby assuming a state adapted to contact the terminals of the intended apparatus. Incidentally, an engaging element may be arranged on the housing 16 and/or the connector element 14 so that the connector element 14 may be releasably locked at a position where the intended apparatus-side contact portions 18 are exposed.

In the case where the device 4 is not in use, on the other hand, the slide knob 24 is moved in the opposite direction thereby to contain the intended apparatus-side contact portions 18 in superposition under the ribs 34, thereby making it possible to protect the intended apparatus-side contact portions 18 from external dust and dirt, etc.

Figure 11:
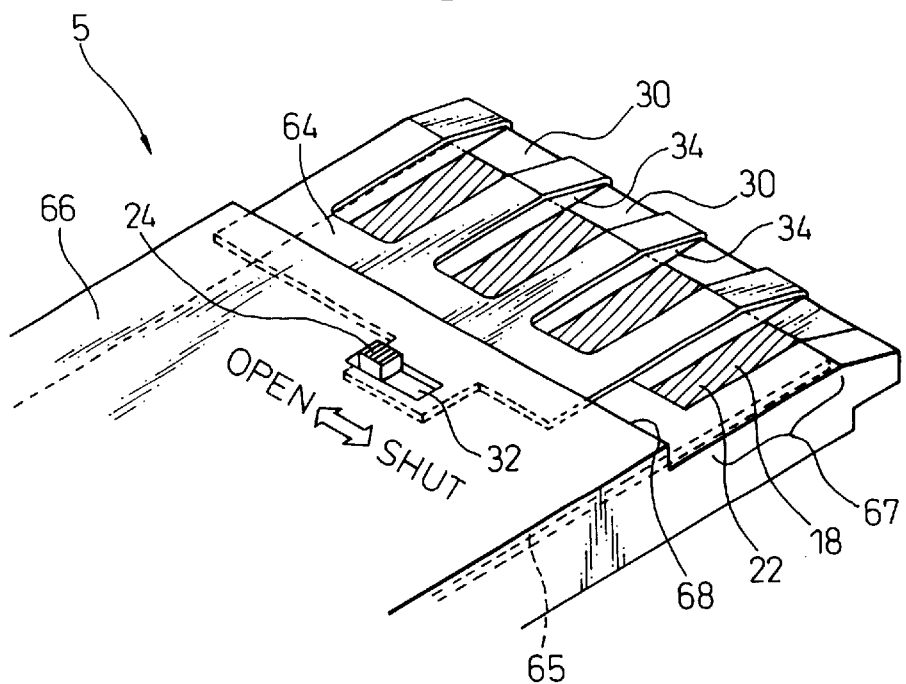
FIG. 11 is a partly enlarged schematic perspective view of a card-type peripheral device according to a fifth embodiment of the invention.

FIG. 11 shows a partly enlarged perspective view schematically showing a card-type peripheral device 5 according to a fifth embodiment of the invention. In this embodiment, the provision of a slide-type dustproof cover 64 makes it possible to assume two states including an open state and a closed state as in the aforementioned embodiment.

The card-type peripheral device 5 comprises a circuit board 65 having electronic parts such as a memory mounted thereon and integrated with a connector element 67 electrically connected to an intended apparatus, a hollow card-type housing 66 for fixedly containing the circuit board 65 and an dustproof cover 64 mounted on the housing 66.

The connector element 67 of the circuit board 65 includes a plurality of contacts 22 adapted to contact the terminals of the intended apparatus and the contacts 22 are formed as a pattern on the circuit board 65 along the front edge of the circuit board 65. The housing 66 includes a plurality of front end slit-like contact portion openings 30 for exposing the contact portions 18 of the contacts 22 of the connector element 67, an opening 68 for receiving the dustproof cover 64 and a rectangular opening 32 for receiving the slide knob 24 of the dustproof cover 64. The slide knob 24 is movable laterally in the opening 32. Each adjacent pair of the contact portion openings 30 are separated by the rib 34. The dustproof cover 64 has a slide knob 24 mounted fixedly thereon, and has such a dimension and a shape that the dustproof cover 64 can close up the contact portion openings 30 of the housing 66 in closed state, while it can be located at a position where each contact portion 18 is fully exposed and the device 5 can be mounted smoothly on the intended apparatus in open state. In the embodiment shown in FIG. 11, the dustproof cover 64 is so shaped as to be superposed on the rib 34 adjacent to each contact portion opening 30 of the housing 66 in open state. The dustproof cover 64 is mounted slidably on the housing 66.

The dimension of the slide knob opening 32 is determined appropriately based on the relation between the shape and dimension of the dustproof cover 64, the dimension of the contact portion openings 30 of the housing 66 and the dimension of the slide knob 24 in such a manner as to make sure that the contact portion openings 30 open, the contact portions 18 of the contacts 22 are sufficiently exposed, the contact portion openings 30 are closed up with the dustproof cover 64 and that the contact portions 18 of the contacts 22 are shielded, by the movement of the slide knob 24 in the slide knob opening 32.

In the card-type peripheral device 5 according to this embodiment, the slide knob 24 of the dustproof cover 64 mounted slidably on the housing 66 is moved linearly within the opening 32 thereby to move the dustproof cover 64. In this way, two states, an open state and a closed state, are assumed. In open state, the contact portion opening 30 is opened to expose the contact portions 18 of the contacts 22, while in closed state, the contact portion openings 30 are closed by the dustproof cover 64 thereby to shield each contact portion 18.

Specifically, when the device 5 is in use, as shown in FIG. 11, the slide knob 24 is moved in such a direction that the dustproof cover 64 is superposed on the ribs 34 thereby to open the contact portion openings 30 of the housing 66, so that the contact portion 18 of each contact 22 is exposed, thereby assuming a state adapted to contact the terminals of the intended apparatus.

When the device 5 is not in use, on the other hand, the slide knob 24 is moved in the opposite direction so that the dustproof cover 64 closes the contact portion openings 30 of the housing 66 thereby to shield the contact portion 18 of each contact 22, thus making it possible to protect each contact portion 18 from external dust and dirt, etc. It is difficult to mount the device 5 on the intended apparatus with the dustproof cover 64 closing the contact portion openings 30 of the housing 66. Therefore, the device 5 in closed state can be prevented from being mounted.

Figure 12:
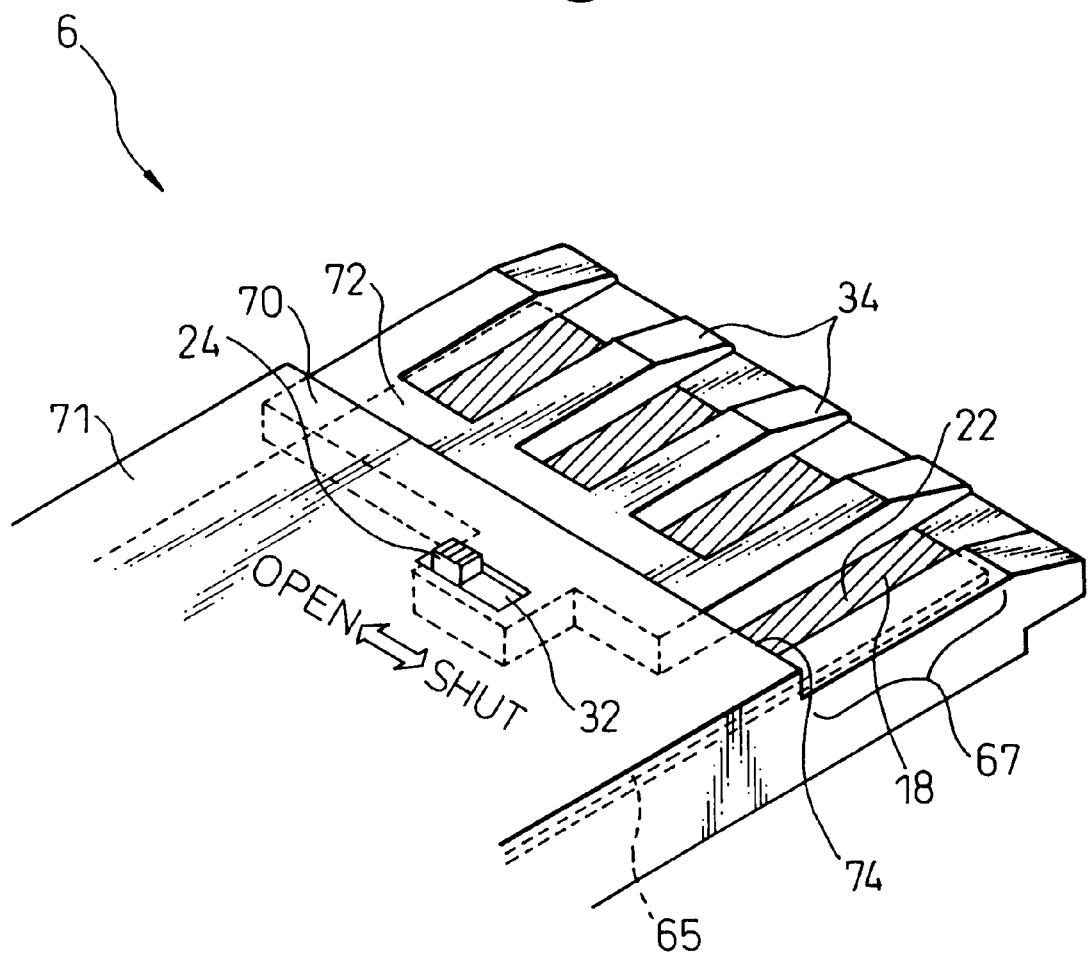
FIG. 12 is a partly enlarged schematic perspective view of a card-type peripheral device according to a sixth embodiment of the invention.

In the card-type peripheral device 6 according to a sixth embodiment of the invention shown in FIG. 12 as a partly enlarged perspective view, a wall portion (rib) formed with the slit-like contact portion openings by separating the contact portions 18 of the contacts 22 is used as a slidable dustproof cover in the card-type peripheral device 5 according to the fifth embodiment described above.

The card-type peripheral device 6 comprises a circuit board 65 having electronic parts such as a memory mounted thereon and integrated with a connector element 67 electrically connected to an intended apparatus, and a hollow card-type housing 70 including a housing body 71 for fixedly accommodating the circuit board 65 and a slide rib 72 mounted slidably on the housing body 71.

The connector element 67 of the circuit board 65 includes a plurality of contacts 22 formed as a pattern on the circuit board 65 along the front edge of the circuit board 65 and adapted to contact the terminals of an intended apparatus. The body 71 of the housing 70 includes a front opening 74 for exposing the connector element 67 of the circuit board 65 and receiving a slide rib 72, and a rectangular opening 32 for receiving the slide knob 24 of the slide rib 72. The slide knob 24 is movable laterally in the opening 32. The slide rib 72, on the other hand, includes the slide knob 24 fixedly mounted on the slide rib 72 and a plurality of ribs 34. The slide rib 72 has such a dimension and such a shape that under the closed state, the contact portions 18 of the contacts 22 of the connector element 67 can be completely shielded, while in open state, each contact 18 is sufficiently exposed and the device 6 can be mounted snugly on the intended apparatus. The slide rib 72 is mounted slidably on the housing body 71.

The dimension of the slide knob opening 32 is appropriately determined based on the relation between the dimension of the contact portion 18 of each contact 22 of the connector element 67, the dimension of the ribs 34 of the slide rib 72, the dimension between the ribs 34 and the dimension of the slide knob 24, etc. in such a manner as to assure by the movement of slide knob 24 within the opening 32 a sufficient exposure of the contact portion 18 of each contact 22 and the full shielding of each contact portion 18 by each rib 34 of the slide rib 72.

In the card-type peripheral device 6 according to this embodiment, the slide knob 24 of the slide rib 72 mounted slidably on the housing body 71 is moved linearly within the opening 32 thereby to move the slide rib 72. In this way, the slide rib 72 can be selectively arranged at two positions including a first position where the contact portion 18 of each contact 22 is exposed between the ribs 34 of the slide rib 72, i.e. in an open state and a second position where each contact portion 18 is shielded by the slide rib 72, i.e. in a closed state.

Specifically, when using the device 6, as shown in FIG. 12, the slide knob 24 is moved to a position where each rib 34 of the slide rib 72 is located between the contact portions 18 of the contact 22, so that the contact portions 18 are exposed between the ribs, thereby assuming a state adapted to contact with the terminals of the intended apparatus.

When the device 6 is not in use, on the other hand, the slide knob 24 is moved in the opposite direction, so that each rib 34 of the slide rib 72 shields each contact portion 18 in superposition on the contact portion 18 of each contact 22 of the connector element 67, thus making it possible to protect each contact portion 18 from external dust and dirt, etc. In view of the fact that it is difficult to mount the device 6 on the intended apparatus with each contact portion 18 shielded by each rib 34, the device 6 in closed state can be prevented from being mounted.

Figure 13A:
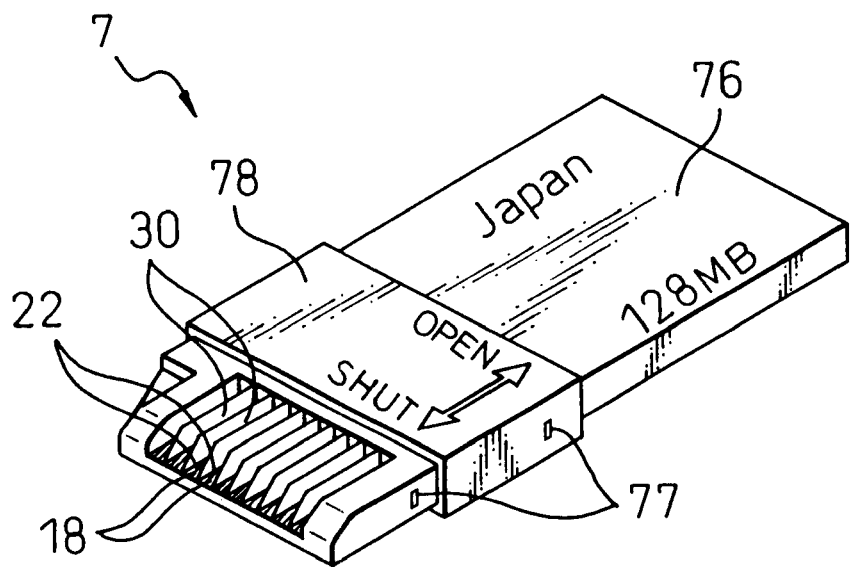
Figure 13B:
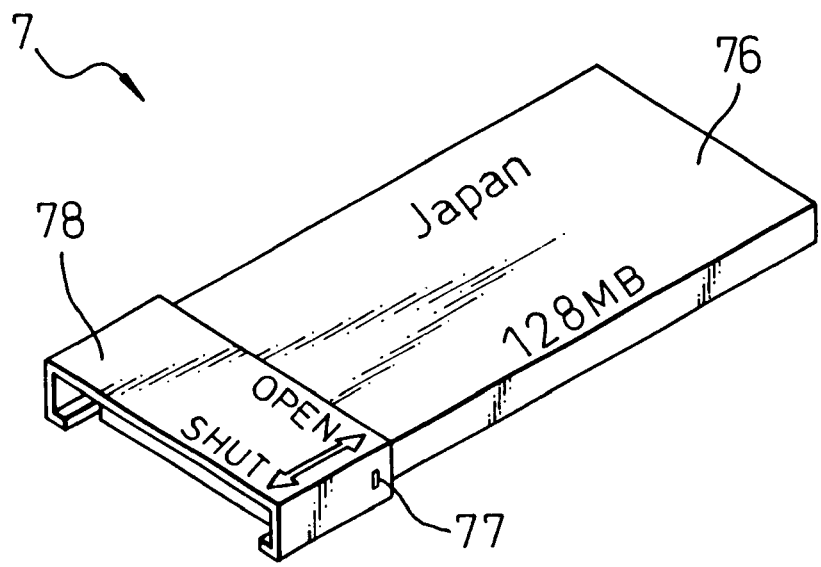

FIGS. 13a, 13b show perspective views schematically showing a card-type peripheral device 7 according to a seventh embodiment of the invention. The card-type peripheral device 7 according to this embodiment comprises a circuit board (not shown) having mounted thereon electronic parts such as a memory and integrated with a connector element having a plurality of contacts 22 formed as a pattern and adapted to contact the terminals of the intended apparatus, and a hollow card-type housing 76 fixedly accommodating the circuit board and having a plurality of slit-like contact portion openings 30 at the front end of the housing 76 to expose the contact portions 18 of the contacts 22 of the connector element, the device further comprising a dustproof cover 78 slidable on the outside of the housing 76.

The dustproof cover 78 is mounted slidably on the outside of the housing 76, and has such a dimension that at least the contact portion openings 30 are closed in the case where the dustproof cover 78 is moved to the contact portion openings 30 formed on the housing 76. The dustproof cover 78 is slidable to a position where the contact portion openings 30 are fully closed with regard to the contact portion openings 30 side of the housing 76 and, in the opposite direction, to a position where the contact portion openings 30 are open so that the contact portions 18 of the contacts 22 are fully exposed and the device 7 can be smoothly mounted on the intended apparatus.

The card-type peripheral device 7 according to this embodiment can assume, by moving the dustproof cover 78 mounted slidably on the housing 76, two states including an open state (FIG. 13a) where the contact portions 18 of the contacts 22 are exposed by opening the contact portion openings 30 of the housing 76 and a closed state (FIG. 13b) where the contact portions 18 are shielded by closing the contact portion openings 30 of the housing 76 with the dustproof cover 78.

Specifically, when using the device 7, as shown in FIG. 13a, the dustproof cover 78 is moved rearward, i.e. away from the contact portion openings 30 of the housing 76 to open the contact portion openings 30, exposing the contact portions 18 of the contacts 22 and thereby assuming a state adapted to contact the terminals of the intended apparatus.

When the device 7 is not in use, on the other hand, as shown in FIG. 13b, the dustproof cover 78 is moved forward, i.e. toward the contact portion openings 30 of the housing 76 thereby to close the contact portion openings 30 with the dustproof cover 78 so that the contact portions 18 of the contacts 22 are shielded, thereby making it possible to protect each contact portion 18 from external dust and dirt, etc. Also, a provisional holding structure 77 of mutual fitting type may be arranged to maintain the dustproof cover 78 in closed state, thereby making it difficult to mount the device 7 on the intended apparatus with the contact portion openings 30 closed by the dustproof cover 78. In this way, the device 7 is prevented from being mounted in closed state. Conversely, the device 7 may be configured in such a way that the dustproof cover 78 is moved by inserting the device 7 into the intended apparatus to transfer from closed state to open state.

Figure 14A:
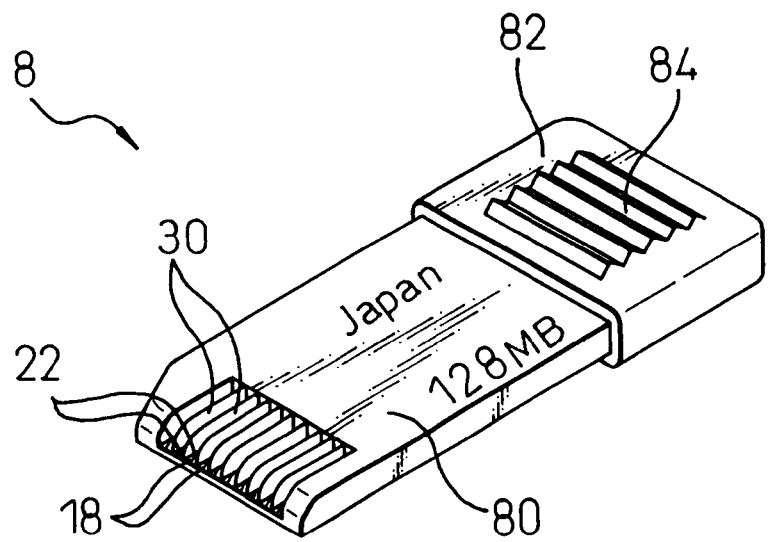
Figure 14B:
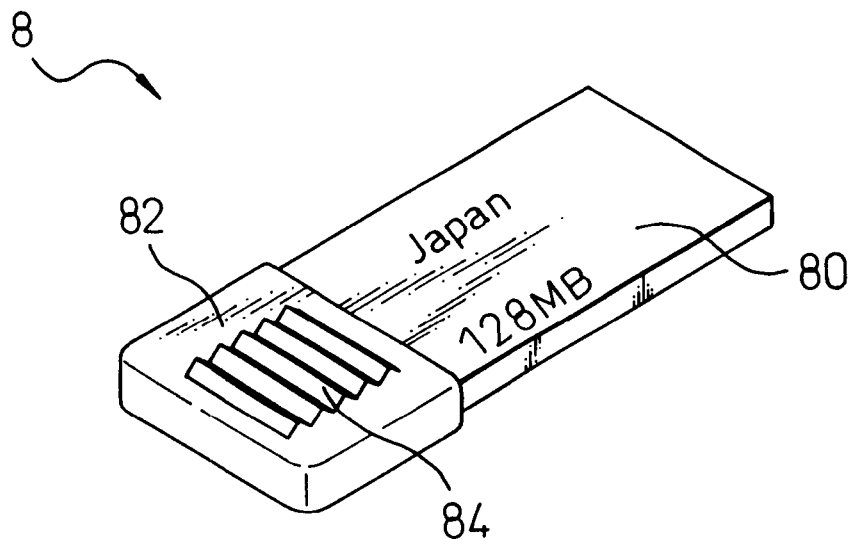

FIGS. 14a, 14b are perspective views schematically showing a card-type peripheral device 8 according to an eighth embodiment of the invention. The card-type peripheral device 8 according to this embodiment comprises a circuit board (not shown) having mounted thereon electronic parts such as a memory and integrated with a connector element having a plurality of contacts 22 formed as a pattern and adapted to contact with the terminals of the intended apparatus, and a hollow card-type housing 80 fixedly accommodating the circuit board and having a plurality of slit-like contact portion openings 30 at the front end of the housing 80 to expose the contact portions 18 of the contacts 22 of the connector element, the device further comprising a dustproof cap 82 mounted releasably on the outside of the housing 80.

The dustproof cap 82 has such a dimension and shape that, when mounted on the contact portion openings 30 of the housing 80, at least the same openings 30 are closed, while when mounted on the opposite side, the contact portion openings 30 are opened so that the contact portions 18 of the contacts 22 are sufficiently exposed and the device 8 can be smoothly mounted on the intended apparatus. The dustproof cap 82 is preferably made of a flexible material such as rubber or urethane to facilitate the mounting on and demounting from the housing 80. Further, an antislip element 84 may be formed on the outer surface of the dustproof cap 82.

The card-type peripheral device 8 according to this embodiment, by mounting the dustproof cap 82 on the contact portion openings 30 side of the housing 80 or on the opposite side, can assume two states including an open state (FIG. 14a) in which the contact portion openings 30 of the housing 80 are opened thereby to expose the contact portions 18 of the contacts 22 and a closed state (FIG. 14b) in which the the contact portion openings 30 of the housing 80 are closed by the dustproof cap 82 thereby to shield the contact portions 18.

Specifically, when using the device 8, as shown in FIG. 14a, the dustproof cap 82 is mounted on the side of the housing 80 far from the contact portion openings 30, to open each contact portion opening 30, so that the contact portions 18 of the contacts 22 are exposed, thereby assuming a state ready for contact with the terminals of the intended apparatus.

When the device 8 is not in use, on the other hand, as shown in FIG. 14b, the dustproof cap 82 is mounted on the contact portion openings 30 side of the housing 80, so that the openings 30 are closed thereby to shield the contact portions 18 of the contacts 22, thus making it possible to protect each contact portion 18 from external dust and dirt, etc. Also, the device 8 in closed state is prevented from being mounted on the intended apparatus because it is difficult to mount the device 8 on the intended apparatus with the contact portion openings 30 closed by the dustproof cap 82.

Figure 15A:
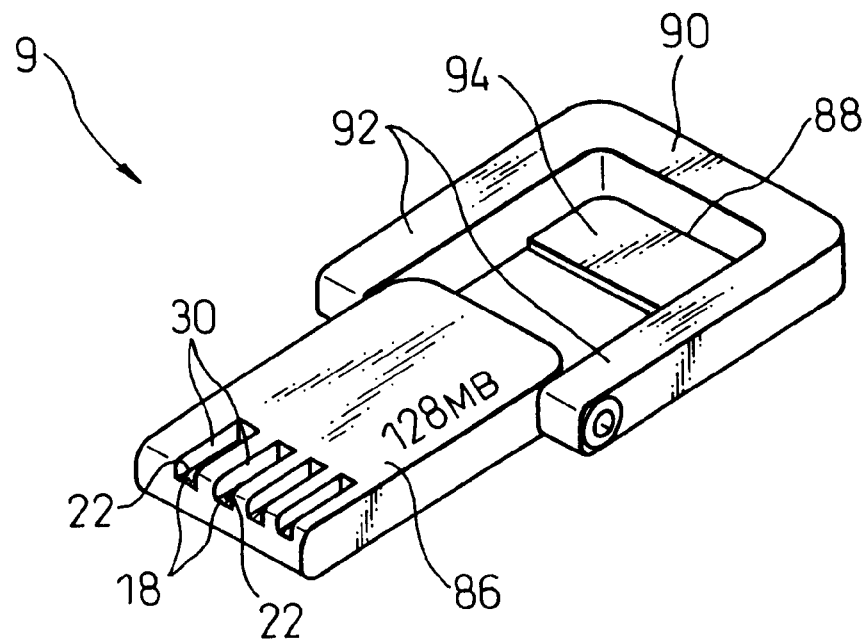
Figure 15B:
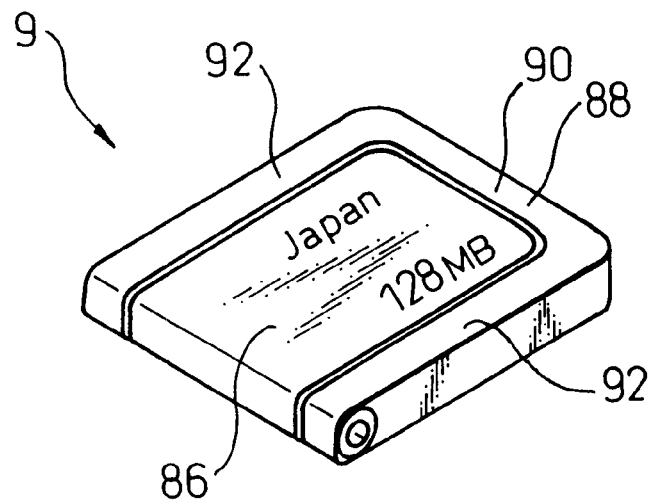

FIGS. 15a, 15b are perspective views schematically showing a card-type peripheral device 9 according to a ninth embodiment of the invention. The card-type peripheral device 9 according to this embodiment comprises a circuit board (not shown) having mounted thereon electronic parts such as a memory and integrated with a connector element having a plurality of contacts 22 formed as a pattern for contact with the terminals of the intended apparatus, and a hollow card-type housing 86 accommodating the circuit board fixedly and having a plurality of slit-like contact portion openings 30 at the front end of the housing 80 to expose the contact portions 18 of the contacts 22 of the connector element, the device further comprising a dustproof cover 88 mounted swingably on the outside of the housing 86.

The dustproof cover 88 includes a channel-shaped frame portion 90 and a cover portion 94 interposed between two arms 92 of the channel-shaped frame portion 90. The dustproof cover 88 is mounted on the housing 86 swingably about the forward end portions of the two arms 92 of the channel-shaped frame portion 90. The cover portion 94 has such a dimension that when the dustproof cover 88 is closed in superposition on the housing 86, at least the contact portion openings 30 formed in the housing 86 are closed. The swing operation of the dustproof cover 88 ranges at least from a closed position where the dustproof cover 88 is overlapped with the housing 86 and the contact portion openings 30 are closed by the cover portion 94 thereby to shield the contact portions 18 of the contacts 22 to an open position where the contact portion openings 30 are opened thereby to sufficiently expose each contact portion 18 and the device 9 is mountable on the intended apparatus.

The card-type peripheral device 9 according to this embodiment, by swinging the dustproof cover 88 swingably mounted on the housing 86, can assume two states including an open state (FIG. 15a) in which the contact portion openings 30 of the housing 86 are opened thereby to expose the contact portions 18 of the contacts 22 and a closed state (FIG. 15b) in which the contact portion openings 30 of the housing 86 are closed by the dustproof cover 88 thereby to shield each contact portion 18.

Specifically, when using the device 9, as shown in FIG. 15a, the dustproof cover 88 is opened so that the angle formed by the housing 86 and the arms 92 of the frame portion 90 of the dustproof cover 88 is about 180° at which the contact portion openings 30 are opened and the contact portions 18 of the contacts 22 are exposed, thereby assuming a state ready for contact with the terminals of the intended apparatus.

When the device 9 is not in use, on the other hand, as shown in FIG. 15b, the dust cover 88 is closed in superposition on the housing 86 so that the cover portion 94 of the dustproof cover 88 closes the contact portion openings 30 of the housing 86 to shield the contact portions 18 of the contacts 22, thereby making it possible to protect each contact portion 18 from external dust and dirt, etc. Also, in view of the fact that it is difficult to mount the device 9 on the intended apparatus with the dustproof cover 88 closed, the device 9 is prevented from being mounted on the intended apparatus in closed state.

It will thus be understood from the foregoing description that, according to this invention, there is provided a card-type peripheral device with a connector element, the device having a function of shielding the contacts not to expose the contacts and thus to prevent the accumulation of dust and dirt on the contacts when the device is not in use.

What is claimed is:

1. A peripheral device to enable card connections comprising:
    a circuit board, a connector element having a plurality of contacts connectable to said circuit board, a hollow housing having a plurality of openings for exposing said contacts and accommodating said circuit board and said connector element, and shield means for shielding said contacts of said connector element selectively, the shield means including a moving mechanism selectively moving said connector element in said housing to either a first position where said contacts are exposed to said openings or a second position where said contacts are shielded within said housing.

2. The peripheral device according to claim 1, wherein said connector element is movable independently of said circuit board, and said contacts are connected to said circuit board when said connector element is located at said first position while said contacts are separated from said circuit board when said connector element is located at said second position.

3. The peripheral device according to claim 2, wherein said connector element includes a second circuit board separate from said first circuit board, and said contacts are formed as a pattern on said second circuit board.

4. The peripheral device according to claim 3, wherein said connector element includes a base member separate from said circuit board, and said contacts are made of conductive plates fixed on said base member.

5. The peripheral device according to claim 1, wherein said connector element is movable integrally with said circuit board, and said contacts are formed as a pattern on said circuit board.

6. The peripheral device according to claim 1, wherein said moving mechanism includes an operational element performing an operation, from outside of said housing, moving said connector element.

7. The peripheral device according to claim 1, wherein said moving mechanism includes an engaging element releasably locking said connector element at said first position.

8. A peripheral device to enable card connections comprising:
    a circuit board, a connector element having a plurality of contacts connectable to said circuit board, a hollow housing having a plurality of openings exposing said contacts and accommodating said circuit board and said connector element, and shield means for shielding said contacts of said connector element selectively and including a wall portion defining said openings of said housing, said wall portion being arranged on said housing so as to be movable between a first position where said contacts of said connector element are exposed to said openings and a second position where said wall portion is superimposed on said contacts thereby to shield said contacts.

9. A peripheral device to enable card connections comprising:
    a circuit board, a connector element having a plurality of contacts connectable to said circuit board, a hollow housing having a plurality of openings exposing said contacts and accommodating said circuit board and said connector element, and shield means for shielding said contacts of said connector element selectively, the shield means including a cover slidably arranged on said housing and selectively opening or closing said openings.

10. The peripheral device according to claim 8, wherein the wall portion of said shield means slidably defines said openings of said housing.

11. A peripheral device to enable card connections comprising a circuit board, a connector element having a plurality of contacts connected to said circuit board, a hollow housing having a plurality of openings exposing said contacts and accommodating said circuit board and said connector element, and shield means for shielding said contacts of said connector element selectively, wherein said connector element is movable independently of said circuit board, and said contacts are connected to said circuit board when said connector element is located at said first position while said contacts are separated from said circuit board when said connector element is located at said second position.

12. The peripheral device according to claim 11, wherein said connector element includes a second circuit board separate from said first circuit board, and said contacts are formed as a pattern on said second circuit board.

13. The peripheral device according to claim 11, wherein said connector element includes a base member separate from said circuit board, and said contacts are made of conductive plates fixed on said base member.

* * * * *